United States Patent [19]

Shou et al.

[11] Patent Number: 5,396,442
[45] Date of Patent: * Mar. 7, 1995

[54] MULTIPLICATION CIRCUIT FOR MULTIPLYING ANALOG INPUTS BY DIGITAL INPUTS

[75] Inventors: Guoliang Shou; Weikang Yang; Sunao Takatori; Makoto Yamamoto, all of Tokyo, Japan

[73] Assignee: Yozan Inc., Tokyo, Japan

[*] Notice: The portion of the term of this patent subsequent to Nov. 1, 2011 has been disclaimed.

[21] Appl. No.: 137,738

[22] Filed: Oct. 19, 1993

[51] Int. Cl.$^6$ ............................................. G06J 1/00
[52] U.S. Cl. ................................................. 364/606
[58] Field of Search ...................... 364/606, 602, 841; 328/160

[56] References Cited

U.S. PATENT DOCUMENTS

| | | | |
|---|---|---|---|
| 3,683,165 | 8/1972 | Grobert et al. | 364/606 |
| 4,470,126 | 9/1984 | Haque | 364/606 |
| 4,616,334 | 10/1986 | Vogelsong et al. | 364/606 |
| 4,833,639 | 5/1989 | Keate | 364/841 |

OTHER PUBLICATIONS

Dorf, "The Electrical Engineering Handbook", CRC Press, 1993, pp. 1861–1865.
Iwai, "A Guide to Logical Circuit", Tokyo Denki Digaku, 1980, pp. 144–146 (Section 8.4).

*Primary Examiner*—Tan V. Mai
*Attorney, Agent, or Firm*—Cushman, Darby & Cushman

[57] ABSTRACT

A multiplication circuit for multiplying an analog input by a digital input. The digital input has a plurality of bits. The circuit has a circuit input terminal for receiving the analog input and a circuit output terminal for outputting the results of multiplication of the analog input by the digital input. The circuit also has a plurality of capacitances and a plurality of switching devices.

3 Claims, 2 Drawing Sheets

MULTIPLICATION CIRCUIT FOR MULTIPLYING ANALOG INPUTS BY DIGITAL INPUTS

FIELD OF THE INVENTION

The present invention relates to a multiplication circuit for multiplying an analog signal by digital signals.

BACKGROUND OF THE INVENTION

Multiplication circuits for multiplying digital signals have normally been very large in scale. While multiplication circuits for multiplying analog signals have normally been inaccurate.

SUMMARY OF THE INVENTION

The present invention is invented so as to solve the problems mentioned above. The multiplication circuit, according to the present invention, can perform precise multiplication while being small in scale and can easily perform various kinds of calculations.

A multiplication circuit according to the present invention includes parallel capacitances for applying various weights to an analog input voltage. The capacitances are connected to a common output and are switched by a switching means, which is controlled by a digital input.

PREFERRED EMBODIMENT OF THE PRESENT INVENTION

Hereinafter, an embodiment according to the present invention is described with reference to the attached drawings.

Figure 1:
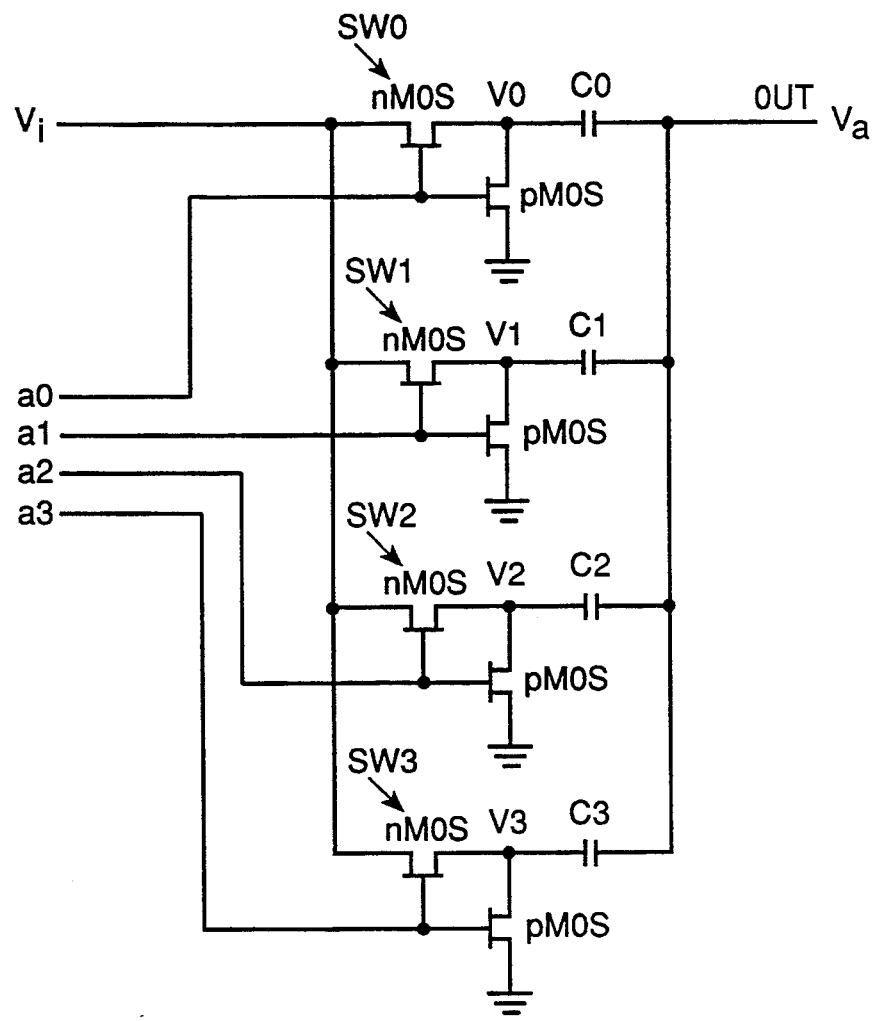
FIG. 1 is an embodiment of a multiplication circuit relating to the present invention.

In FIG. 1, a multiplication circuit includes capacitances C0, C1, C2 and C3. Each capacitance has a different capacity and each capacitance is connected to a common output terminal.

An input terminal of each capacitance is connected with a source of an nMOS transistor and a drain of pMOS transistor. The drain of nMOS is connected to a common input voltage $V_i$.

The nMOS and pMOS transistor pair comprises a toggle switch, which alternatively closes and connects input voltage $V_i$ or ground (i.e. $\phi$ volts) to the corresponding capacitance. Toggle switches corresponding to capacitances C0 to C3 are defined as SW0–SW3, respectively. The gate voltages SW0–SW3 are defined as a0–a3, respectively. Only the switches having a gate voltage at a high level causes input voltage $V_i$ to be applied to the corresponding capacitance.

Voltage $V_0$, which is $(C0V1+C1V1+C2V2+C3V3)/(C0+C1+C2+C3)$, is generated at the output when capacitances C0–C3 are connected to the output terminal in a parallel manner and the voltages impressed on each capacitance are defined as V0–V3. These voltages (i.e., V0 to V3) are either $V_i$ or 0.

Defining an unit of capacity as c and settling C0=1c, C1=2c, C2=4c and C4=8c, it is possible to calculate optional integral of $V_0=\{(0-15) \times V_i\}/15$ due to the opening and closing of switches SW0–SW3.

The switches from SW0–SW3 are controlled to be opened or closed by the gate voltages from a0–a3. When there is a condition that $Ck=2^k$, control voltages from a0 to ak−1 are settled optionally as a multiplier of K bits. In the embodiment depicted in FIG. 1, K is 4.

Figure 2:
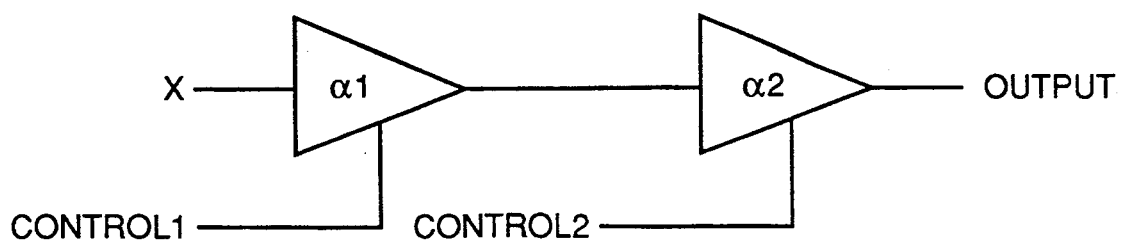
FIG. 2 is a block diagram showing a circuit composition using multiplication circuits according to the present invention.

FIG. 2 shows an embodiment of serial multiplication circuits. α1 and α2 are similar to the multiplication circuit depicted in FIG. 1. When an input is x and the multipliers are defined as α1 and α2, which are same signs, a multiplication of α1 by α2 by x is produced.

Figure 3:
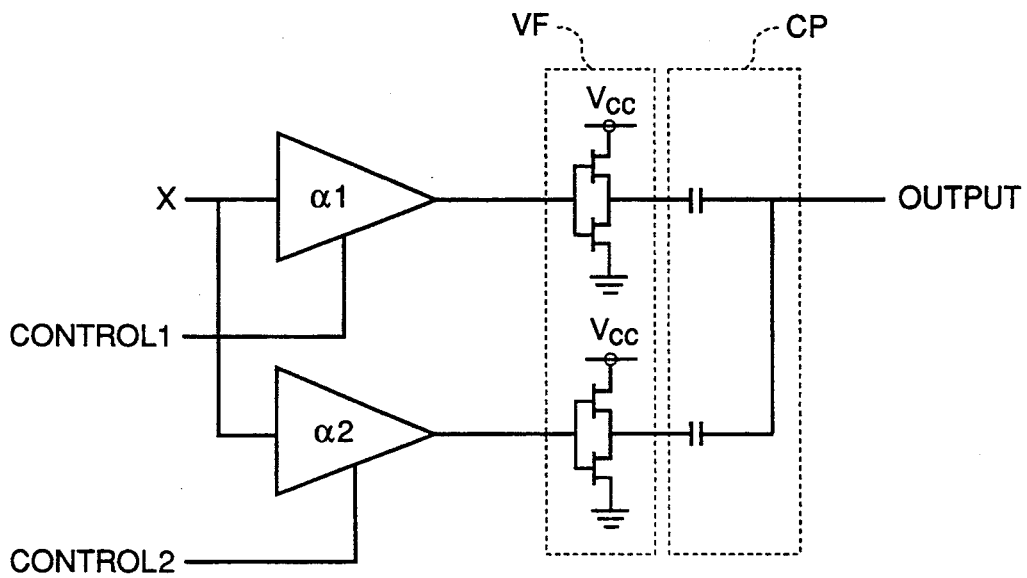
FIG. 3 is another block diagram showing a circuit composition using multiplication circuits according to the present invention.

In FIG. 3, outputs of multiplication circuits α1 and α2 are connected in parallel and are stabilized by voltage follower VF. The outputs are summed by joining 2 input capacitances CP. By this circuit, it is possible to produce the calculation (α1+α2)x.

Figure 4:
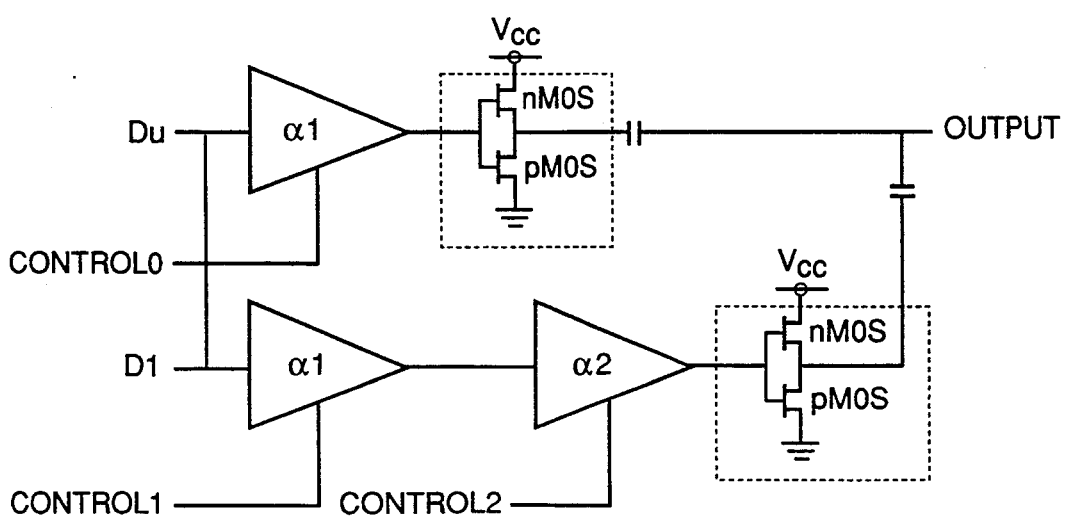
FIG. 4 is a block diagram of a third embodiment using multiplication circuits according to the present invention.

In FIG. 4, the analog input is divided into an upper level Du and a lower level D1. Multiplication of α1 is performed on both Du and D1. While multiplication of α2 is only performed on D1. In other words, calculation (α1Du+α1α2D1) is performed.

As mentioned above, the circuit according to the present invention is small in scale and is also precise. Various kinds of calculations can be obtained because the circuit which can perform the multiplication is small in scale and precise. Thus, various kinds of calculations can be performed.

What is claimed is:

1. A multiplication circuit comprising:
   a circuit input terminal for receiving an analog input;
   a circuit output terminal for outputting a result of multiplication of the analog input by a digital input, the digital input having a plurality of bits;
   a plurality of capacitors, each being commonly connected to the circuit output terminal; and
   a plurality of switching means, each being connected to one of the capacitors and each being commonly connected to the circuit input tereminal, for selectively outputting the analog input, each switching means having a control terminal for receiving one of the bits.

2. A multiplication circuit according to claim 1, wherein each said switching means comprises:
   an nMOS transistor having a drain connected to the circuit input terminal, a gate for receiving one of the bits, and a source; and
   a pMOS transistor having a drain connected to the source of the nMOS transistor and one of the capacitors, and a gate connected to the gate of the nMOS transistor.

3. A multiplacation circuit according to claim 1, wherein a capacitance of each of the capacitors is selected to satisfy the formula:

$$c_n = 2^n c_i,$$

wherein $c_n$ is a capacitance of the nth capacitor and $c_i$ is a lowest desired capacitance.

* * * * *